(12) United States Patent
Kanj

(10) Patent No.: US 12,706,143 B1
(45) Date of Patent: Aug. 11, 2026

(54) MEMRISTOR-ENABLED PROGRAMMABLE SENSING AND SWITCHING THRESHOLD ADJUSTMENT

(71) Applicant: Synopsys, Inc., Sunnyvale, CA (US)

(72) Inventor: Rouwaida Nawaf Kanj, Cedar Park, TX (US)

(73) Assignee: Synopsys, Inc., Sunnyvale, CA (US)

( * ) Notice: Subject to any disclaimer, the term of this patent is extended or adjusted under 35 U.S.C. 154(b) by 204 days.

(21) Appl. No.: 18/509,236

(22) Filed: Nov. 14, 2023

(51) Int. Cl.
*G11C 13/00* (2006.01)

(52) U.S. Cl.
CPC ........ *G11C 13/003* (2013.01); *G11C 13/0069* (2013.01); *G11C 2213/79* (2013.01)

(58) Field of Classification Search
CPC .............. G11C 13/003; G11C 13/0069; G11C 2213/79
See application file for complete search history.

(56) References Cited

U.S. PATENT DOCUMENTS

| | | | | |
|---|---|---|---|---|
| 6,697,277 B2 * | 2/2004 | Towler | G11C 29/028 365/189.11 |
| 10,424,380 B1 * | 9/2019 | Li | G11C 14/0081 |
| 2023/0253037 A1 * | 8/2023 | Wang | H10B 10/12 |
| 2024/0046988 A1 * | 2/2024 | Pedretti | G06F 18/22 |
| 2024/0071490 A1 * | 2/2024 | Nazarian | G11C 7/24 |

OTHER PUBLICATIONS

Atasoyu, M., et al., “Spin-Torque Memristor based Offset Cancellation Technique for Sense Amplifiers,” 14th International Conference on Synthesis, Modeling, Analysis and Simulation Methods and Applications to Circuit Design IEEE, 2017, pp. 1-4.
Kim, T., et al., “A High-density Subthreshold Sram With Data-independent Bitline Leakage and Virtual Ground Replica Scheme,” IEEE International Solid-State Circuits Conference Digest of Technical Papers, 2007, pp. 1-3.
Patel, C., et al., “Study of Comparator and their Architectures,” International Journal of Multidisciplinary Consortium, 2014, vol. 1(1), pp. 1-13.
Sheng, X., et al., “Low-conductance and Multilevel Cmos-integrated Nanoscale Oxide Memristors,” Advanced electronic materials, 2019, vol. 5(9), pp. 1-25.

* cited by examiner

*Primary Examiner* — Jerome Leboeuf
(74) *Attorney, Agent, or Firm* — Weaver Austin Villeneuve & Sampson LLP

(57) ABSTRACT

A circuit includes a PMOS transistor having a source terminal coupled to a first node and a drain terminal coupled to a second node; a first programmable memristor having a first terminal coupled to the first node and a second terminal receiving a first voltage; and a first select transistor having a terminal coupled to the first node, a second terminal coupled to a third node adapted to receive a second voltage, and a gate terminal receiving a first select signal. The resistance of the first programmable memristor is responsive to a difference between the first and second voltages to change a pullup strength of the PMOS transistor. The circuit may further include a NMOS transistor; a second programmable memristor and a second select transistor. The resistance of the second programmable memristor may be changes using the second select transistor to change a pulldown strength of the NMOS transistor.

19 Claims, 16 Drawing Sheets

Table I

| | | RBL | SH | Sp1 | Sel1 | SL | Sel2 | Sp2 |
|---|---|---|---|---|---|---|---|---|
| Program | Memristor 305 | VH | VH/VL | VL/VH | VH | VL | VL | VL |
| | Memristor 315 | VL | VL | VL | VL | VH/VL | VL/VH | VH |
| Normal operations | | From Circuit | VH | VL | VL | VL | VL | VL |

FIG. 3B

Table II

| | | Vin/Vref | Clk | SH | Sel1/2 | Sp1/2 | SL | Sel3/4 | Sp3/4 |
|---|---|---|---|---|---|---|---|---|---|
| Program | 405, 455 | VL | V1 -> VH | VH/VL | VH | VL/VH | VL | VL | VL |
| | 415 | VL | VH | VL | VL | VL | VL/VH | Sel3:VH<br>Sel4:VL | VH/VL |
| | 465 | VL | VH | VL | VL | VL | VL/VH | Sel3:VL<br>Sel4:VH | VH/VL |
| Normal operation | | From circuit | VH/VL | VH | VL | VL | VL | VL | VL |

*FIG. 4B*

Table III

| | | Vin/Vref | Clk | SH1 | SH2 | Sel1/2 | Sp1/2 | SL | Sel3/4 | Sp3/4 |
|---|---|---|---|---|---|---|---|---|---|---|
| Program | 405, 455 | VL | VL | VH | VH/VL | VH | VL/VH | VL | VL | VL |
| | 415 | VL | VH | VH | VL | VL | VL | VL/VH | Sel3:VH<br>Sel4:VL | VH/VL |
| | 465 | VL | VH | VH | VL | VL | VL | VL/VH | Sel3:VL<br>Sel4:VH | VH/VL |
| Normal operation | | From circuit | VH/VL | VH | VH | VL | VL | VL | VL | VL |

*FIG. 5B*

MEMRISTOR-ENABLED PROGRAMMABLE SENSING AND SWITCHING THRESHOLD ADJUSTMENT

TECHNICAL FIELD

The present application relates to adjusting the pullup strength or the pulldown strength of a transistor or the switching threshold of an inverter or a sensing circuit via one or memristors.

BACKGROUND

A semiconductor integrated circuit (IC) may fail to meet specified functionality or timing requirements due to such effects as statistical variations in fabrication processes, voltage or temperature, leakage current, or aging. Such effects may change the pullup strength or the pulldown strength of a transistor, or a block of transistors, switching threshold voltage of an inverter, or the sensing of the bitlines of a memory during a read operation.

SUMMARY

A circuit, in accordance with one embodiment of the present disclosure, includes, in part, a first PMOS transistor having a source terminal coupled to a first node and a drain terminal coupled to a second node; a first programmable memristor having a first terminal coupled to the first node and a second terminal adapted to receive a first voltage; and a first select transistor having a first source/drain terminal coupled to the first node, a second drain/source terminal coupled to a third node adapted to receive a second voltage, and a gate terminal receiving a first select signal. The resistance of the first programmable memristor is responsive to a difference between the first and second voltages thereby to change a pullup strength of the first PMOS transistor.

In one embodiment, the circuit further includes, in part, a first NMOS transistor having a drain terminal coupled to a fourth node and a source terminal coupled to a fifth node; a second programmable memristor having a first terminal coupled to the fifth node and a second terminal coupled to a third voltage; and a second select transistor having a first source/drain terminal coupled to the fifth node, a second drain/source terminal coupled to a sixth node adapted to receive a fourth voltage, and a gate terminal receiving a second select signal. The resistance of the second programmable memristor is responsive to a difference between the third and fourth voltages thereby to change a pulldown strength of the first NMOS transistor.

In one embodiment, the second node is connected to the fourth node thus causing the first PMOS transistor and the first NMOS transistor to form an inverter. In one embodiment, the third voltage is a ground voltage or a virtual ground voltage. In one embodiment, the resistance of the first programmable memristor increases if the first voltage is greater than the second voltage, and decreases if the second voltage is greater than the first voltage. In one embodiment, the first select transistor and the second select transistor are NMOS transistors.

In one embodiment, the circuit further includes, in part, a second PMOS transistor having a source terminal coupled to a drain terminal of the first PMOS transistor and a drain terminal coupled to a fourth node. In one embodiment, the circuit further includes, in part, a second PMOS transistor having a source terminal coupled to a fourth node and a drain terminal coupled to the second node; a second programmable memristor having a first terminal coupled to the fourth node and a second terminal adapted to receive the first voltage; and a second select transistor having a source/drain terminal coupled to the fourth node, a drain/source terminal coupled to a fifth node adapted to receive the second voltage, and a gate terminal receiving a second select signal. The resistance of the second programmable memristor is responsive to a difference between the first and second voltages thereby to change a pullup strength of the second PMOS transistor.

In one embodiment, the circuit further includes, in part, a second PMOS transistor having a source terminal coupled to the first node and a drain terminal coupled to the second node. In one embodiment, the circuit further includes, in part, a second select transistor adapted to supply the first voltage to the second terminal of the first programmable memristor in response to a signal applied to a gate terminal of the second select transistor.

In one embodiment, the circuit further includes, in part, a second NMOS transistor having a source terminal coupled to the drain terminal of the first NMOS transistor; a second PMOS transistor having a drain terminal coupled to a drain terminal of the second NMOS transistor, and a gate terminal coupled to a gate terminal of the second NMOS transistor; a third programmable memristor coupled between a source terminal of the second PMOS transistor and a terminal supplying the first voltage; a third NMOS transistor having a drain terminal coupled to the drain terminal of the first PMOS transistor, and a gate terminal coupled to a gate terminal of the first PMOS transistor; a fourth NMOS transistor having a drain terminal coupled to a source terminal of the third NMOS transistor, and a gate terminal receiving a reference voltage; a third programmable memristor coupled between a source terminal of the second PMOS transistor and a first supply terminal supplying the first voltage; a fourth programmable memristor having a first terminal coupled to a source terminal of the fourth NMOS transistor; a third PMOS transistor having a source terminal receiving the first voltage, a drain terminal coupled to a drain terminal of the second PMOS transistor, and a gate terminal receiving a clock signal; a fourth PMOS transistor having a source terminal receiving the first voltage, a drain terminal coupled to the drain terminal of the first PMOS transistor, and a gate terminal receiving the clock signal; and a fifth NMOS transistor having a drain terminal coupled to a second terminal of the fourth programmable memristor, a source terminal receiving the third voltage, and a gate terminal receiving the clock signal.

A method, in accordance with one embodiment of the present disclosure, includes in part, forming a first PMOS transistor having a source terminal coupled to a first node and a drain terminal coupled to a second node; forming a first programmable memristor having a first terminal coupled to the first node and a second terminal adapted to receive a first voltage; forming a first select transistor having a first source/drain terminal coupled to the first node, a second drain/source terminal coupled to a third node adapted to receive a second voltage, and a gate terminal receiving a first select signal; and passing a first current through the first programmable memristor via the first select transistor to change a resistance of the first programmable memristor thereby to change a pullup strength of the first PMOS transistor.

In one embodiment, the method further includes, in part, forming a first NMOS transistor having a drain terminal coupled to a fourth node and a source terminal coupled to a fifth node; forming a second programmable memristor having a first terminal coupled to the fifth node and a second terminal coupled to a third voltage; forming a second select transistor having a first source/drain terminal coupled to the fifth node, a second drain/source terminal coupled to a sixth node adapted to receive a fourth voltage, and a gate terminal receiving a second select signal; and passing a second current through the second programmable memristor via the select transistor to change a resistance of the second programmable memristor thereby to change a pulldown strength of the first NMOS transistor.

In one embodiment, the method further includes, in part, connecting the second node to the fourth node to form an inverter between the first PMOS transistor and the first NMOS transistor. In one embodiment, the third voltage is a ground voltage or a virtual ground voltage. In one embodiment, the circuit further includes, in part, causing the first current to flow from the first terminal of the first programmable memristor to a seventh node supplying the first voltage. In one embodiment, the circuit further includes, in part, causing the first current to flow from a seventh node supplying the first voltage to the first terminal of the first programmable memristor. In one embodiment, the first select transistor and the second select transistor are NMOS transistors.

In one embodiment, the method further includes, in part, forming a second NMOS transistor having a source terminal coupled to the drain terminal of the first NMOS transistor; forming a second PMOS transistor having a drain terminal coupled to a drain terminal of the second NMOS transistor, and a gate terminal coupled to a gate terminal of the second NMOS transistor; forming a third programmable memristor coupled between a source terminal of the second PMOS transistor and a terminal supplying the first voltage; forming a third NMOS transistor having a drain terminal coupled to the drain terminal of the first PMOS transistor, and a gate terminal coupled to a gate terminal of the first PMOS transistor; forming a fourth NMOS transistor having a drain terminal coupled to a source terminal of the third NMOS transistor, and a gate terminal receiving a reference voltage; forming a third programmable memristor coupled between a source terminal of the second PMOS transistor and a first supply terminal supplying the first voltage; forming a fourth programmable memristor having a first terminal coupled to a source terminal of the fourth NMOS transistor; forming a third PMOS transistor having a source terminal receiving the first voltage, a drain terminal coupled to a drain terminal of the second PMOS transistor, and a gate terminal receiving a clock signal; forming a fourth PMOS transistor having a source terminal receiving the first voltage, a drain terminal coupled to the drain terminal of the first PMOS transistor, and a gate terminal receiving the clock signal; and forming a fifth NMOS transistor having a drain terminal coupled to a second terminal of the fourth programmable memristor, a source terminal receiving the third voltage, and a gate terminal receiving the clock signal.

A system, in accordance with one embodiment of the present disclosure, includes, in part a memory storing instructions; and a processor, coupled with the memory and to execute the instructions. The instructions when executed cause the processor to form a circuit that includes, in part, a first PMOS transistor having a source terminal coupled to a first node and a drain terminal coupled to a second node; a first programmable memristor having a first terminal coupled to the first node and a second terminal adapted to receive a first voltage; and a first select transistor having a first source/drain terminal coupled to the first node, a second drain/source terminal coupled to a third node adapted to receive a second voltage, and a gate terminal receiving a first select signal. The resistance of the first programmable memristor is responsive to a difference between the first and second voltages thereby to change a pullup strength of the first PMOS transistor.

In one embodiment, the circuit further includes, in part, a first NMOS transistor having a drain terminal coupled to a fourth node and a source terminal coupled to a fifth node; a second programmable memristor having a first terminal coupled to the fifth node and a second terminal coupled to a third voltage; and a second select transistor having a first source/drain terminal coupled to the fifth node, a second drain/source terminal coupled to a sixth node adapted to receive a fourth voltage, and a gate terminal receiving a second select signal. The resistance of the second programmable memristor is responsive to a difference between the third and fourth voltages thereby to change a pulldown strength of the first NMOS transistor.

DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 3B shows a Table depicting the voltages applied to various nodes/terminals of the memristor-enable inverter of FIG. 3A during both a programming phase as well as during the normal operation of the inverter, in accordance with one embodiment of the present disclosure.

FIG. 4B shows a Table depicting the voltages applied to various nodes/terminals of the comparator of FIG. 4A, in accordance with one embodiment of the present disclosure.

FIG. 5B shows a Table depicting the voltages applied to various nodes/terminals of the comparator of FIG. 5A, in accordance with one embodiment of the present disclosure.

DETAILED DESCRIPTION

One aspect of the present disclosure relates to making the pullup strength or the pulldown strength of a transistor, or the pullup strength or the pulldown strength of a group/block of connected transistors, programmable using a memristor. Other aspects of the present disclosure relate to making the switching characteristics of circuit blocks, such as inverters, comparators, sense amplifiers, and the like, programmable using a memristor.

In one embodiment, the pullup strength of a p-channel metal-oxide-semiconductor (PMOS) field effect transistor may be adjusted by programming a memristor disposed between the source terminal of the PMOS transistor and the supply voltage. In another embodiment, the pulldown strength of an n-channel metal-oxide-semiconductor (NMOS) field effect transistor may be adjusted by programming a memristor disposed between the source terminal of the NMOS transistor and the ground or the virtual ground. The switching threshold voltage of a sensing circuit, such as an inverter, used, for example, in a memory may be adjusted using one or more memristors disposed in the sensing circuit to compensate for the bitline leakages that may occur due to, for example, aging effects and other statistical variations.

A memristor, as used in accordance with any of the embodiments of the present disclosure, may be a multi-level programable memristor used post fabrication, to change the pullup/pulldown strength of a transistor, or a group of connected transistors, or the switching threshold voltage of an inverter, comparator, sense amplifier, and the like. The memristor may be further used, for example, to speed up or slow down select design blocks and signal/clock paths, achieve synchronization, and/or compensate for variability in the design. The memristor may be made, for example, from Tantalum Oxide and have a programmable resistance ranging from, for example, 1K to 50K Ohms.

Figure 1A:
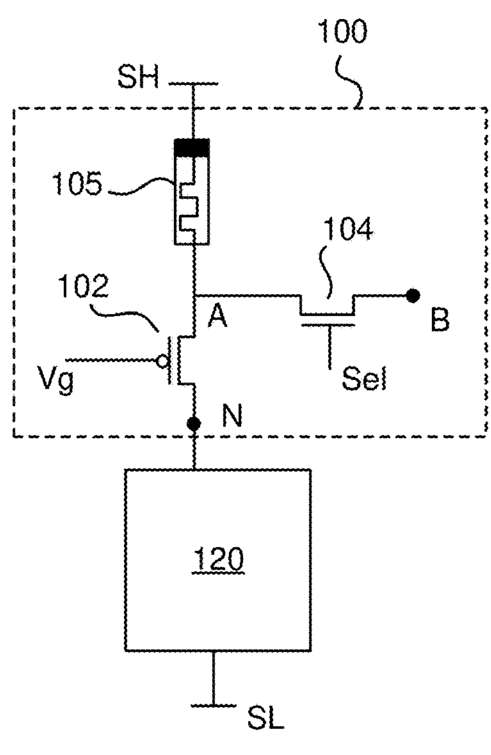
FIG. 1A is a schematic diagram of an example of a memristor-enabled pullup circuit in accordance with one embodiment of the present disclosure.

FIG. 1A is a schematic diagram of a memristor-enabled pullup (alternatively referred to herein as pullup) 100 circuit, in accordance with one embodiment of the present disclosure. Pullup circuit 100 is shown as including a PMOS transistor 102, a select transistor 104, and a programmable memristor 105. As shown, the source terminal A of transistor 102 is coupled to supply voltage SH via memristor 105. The source terminal of transistor 102 is also coupled to the source/drain terminal of programming select transistor 104 which receives the signal Sel at its gate terminal. Circuit block 120 is disposed between the drain terminal of transistor 102 and supply voltage SL. In one example, during normal operation, supply voltage SH may be 1 volt, and supply voltage SH may be a ground voltage or a virtual ground voltage.

To adjust the pullup strength of pullup circuit 100, during a programming phase and post fabrication, memristor 105 is programmed to achieve a desired resistance. For example, to decrease the resistance of memristor 105 and thereby increase the pullup strength of pullup circuit 100, node B of select transistor 104 is raised to a voltage that is higher than voltage SH. For example, supply voltage SH may be set to 0V and node B may be set to 1.5V. Signals VG and Sel, applied to the gate terminals of transistors 102 and 104 respectively, are also raised to relatively high voltages thus causing transistor 102 to turn off and transistor 104 to turn on. Accordingly, a current is caused to flow from node B to supply voltage SH via memristor 105 thus causing the resistance of memristor 105 to decrease. The amount of decrease in the resistance of memristor 105 may be controlled by changing the duration or the amplitude of the current flow through the memristor.

In a similar manner, to increase the resistance of memristor 105, and thereby decrease the pullup strength of pullup circuit 100, node B of transistor 104 is set to a voltage that is smaller than voltage SH. For example, node B may be set to 0V and supply voltage SH may be set to 1.5V. Signals VG and Sel are also raised to relatively high voltages thus causing transistor 102 to turn off and transistor 104 to turn on. Accordingly, a current is caused to flow from supply voltage SH to node B via memristor 105 thus causing the resistance of memristor 105 to increase. The amount of increase in the resistance of memristor 105 may be controlled by changing the duration or the amplitude of the current flow through the memristor.

In other embodiments, a current flow from node B to supply voltage SH via memristor 105 causes the resistance of memristor 105 to decrease, and a current flow from supply voltage SH to node B via memristor 105 causes the resistance of memristor 105 to increase. Accordingly, during the programming phase, the direction of the current flow through memristor 105 determines whether the memristor's resistance is to increases or decreases, and the duration or the amplitude of the current flow through the memristor determines the amount of such increase/decrease.

Figure 1B:
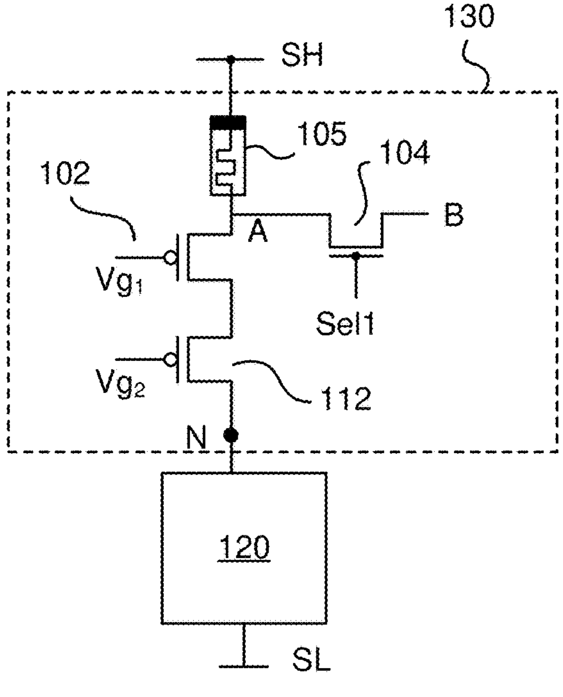
FIG. 1B is a schematic diagram of an example of a memristor-enabled pullup circuit in accordance with one embodiment of the present disclosure.

FIG. 1B is a schematic diagram of a memristor-enabled pullup circuit 130, in accordance with another embodiment of the present disclosure. The circuit shown in FIG. 1B is similar to the circuit shown in FIG. 1A, except that in FIG. 1B, pullup block 130 includes a second PMOS transistor 112 connected between the drain terminal of PMOS transistor 102 and node N to which circuit block 120 is connected. Select transistor 104 together with memristor 105 are used to change the pullup strength of the pullup transistors block formed by PMOS transistors 102 and 112 in the same manner as described above with reference to FIG. 1A.

Figure 1C:
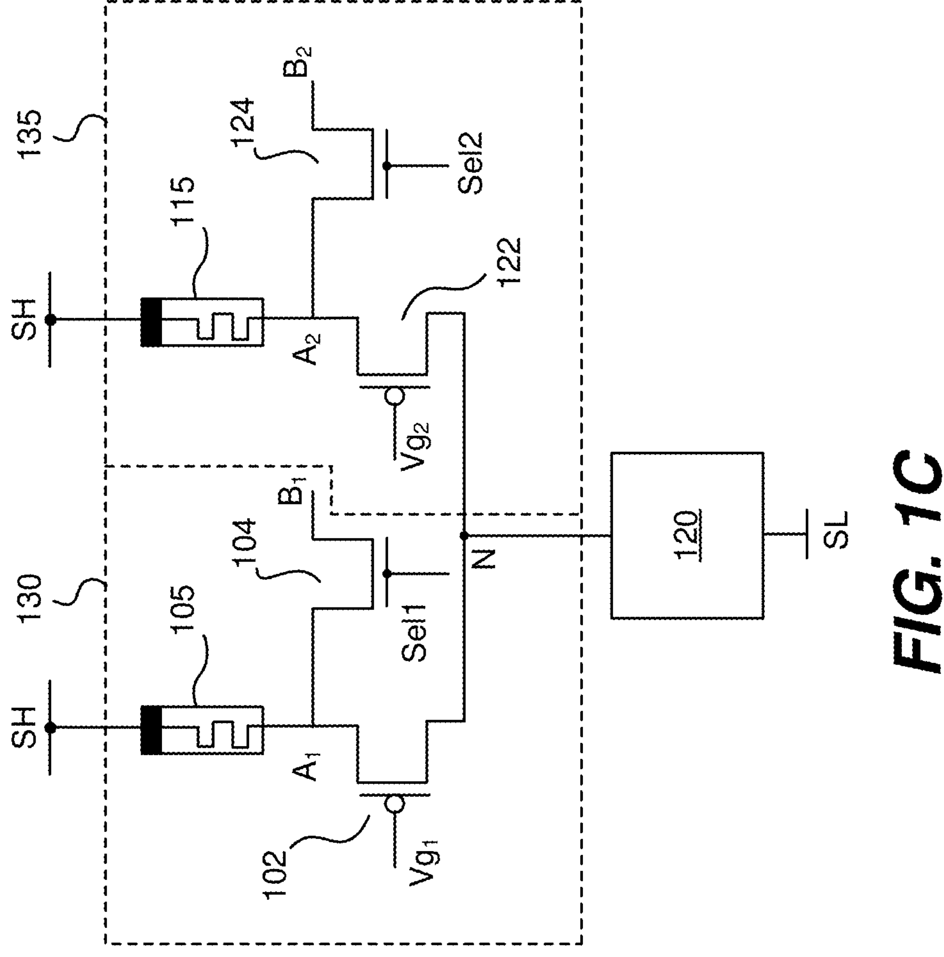
FIG. 1C is a schematic diagram of an example of a memristor-enabled pullup circuit in accordance with one embodiment of the present disclosure.

FIG. 1C is a schematic diagram of memristor-enabled pullup circuits, in accordance with one embodiment of the present disclosure. PMOS transistor 102, select transistor 104, and programmable memristor 105 form a first memristor-enable pullup circuit 130. PMOS transistor 122, select transistor 124, and programmable memristor 125 form a second memristor-enable pullup circuit 135. The drain terminals of both PMOS transistors 102 and 112 is connected to circuit block 120 at node N. Memristor 105 may be programmed via select transistor 104 to change the pullup strength of PMOS transistor 102, and memristor 115 may be programmed via select transistor 124 to change the pullup strength of PMOS transistor 122 in the same manner as was described above with reference to FIG. 1A.

Figure 1D:
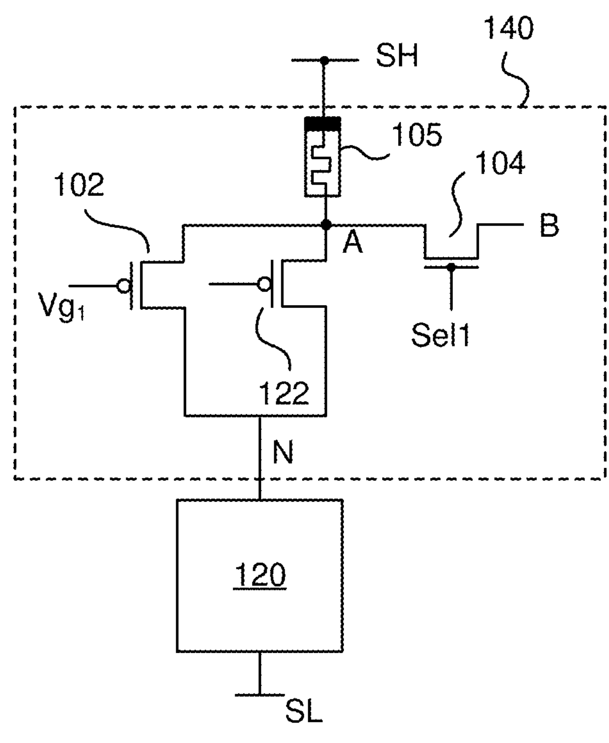
FIG. 1D is a schematic diagram of an example of a memristor-enabled pullup circuit in accordance with one embodiment of the present disclosure.

FIG. 1D is a schematic diagram of a memristor-enabled pullup circuit 140, in accordance with one embodiment of the present disclosure. The memristor-enabled pullup circuit 140 of FIG. 1D is similar to memristor-enabled pullup circuits 130 and 135 shown in FIG. 1C, except that in memristor-enabled pullup circuit 140, a single memristor 105 is used for both PMOS transistors 102 and 104. Memristor-enabled pullup circuit 140 is also shown as including a single select transistor 104 used to program memristor 105.

Figure 1E:
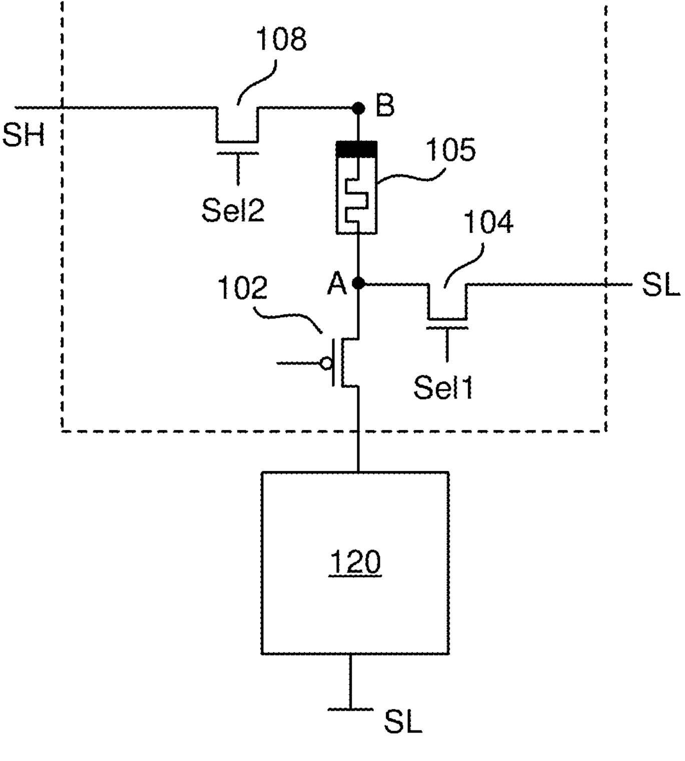
FIG. 1E is a schematic diagram of an example of a memristor-enabled pullup circuit in accordance with one embodiment of the present disclosure.

FIG. 1E is a schematic diagram of a memristor-enabled pullup circuit 125, in accordance with another embodiment of the present disclosure. Memristor-enabled pullup circuit 125 is similar to memristor-enabled pullup circuit 100 shown in FIG. 1A, except that memristor-enabled pullup circuit 125 includes a pair of select transistors 108 and 104. The first terminal of memristor 105 is shown as being connected to node A as is also shown in FIG. 1A. The second terminal of memristor 105 is connected to node B which is also connected to the source/drain terminal of transistor 108. The drain/source terminal of transistor 108 is connected to supply voltage SH. Therefore, to program memristor 105, a current is caused to flow from supply voltage SH to supply voltage SL through select transistor 108, memristor 105 and select transistor 104. It is understood that any number of select transistors may be used to program a memristor, in accordance with embodiments of the present disclosure allowing embedding the memristor within design blocks.

Figure 2A:
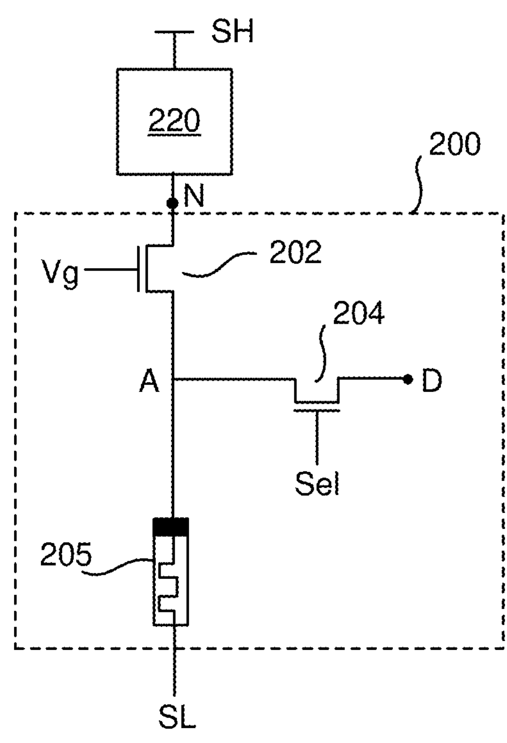
FIG. 2A is a schematic diagram of an example of a memristor-enabled pulldown circuit, in accordance with one embodiment of the present disclosure.

FIG. 2A is a schematic diagram of a memristor-enabled pulldown (alternatively referred to herein as pulldown circuit) 200 circuit, in accordance with one embodiment of the present disclosure. Pulldown circuit 200 is shown as including an NMOS transistor 202, a select transistor 204, and a programmable memristor 205. As shown, the source terminal C of transistor 202 is coupled to supply voltage SL via memristor 205. The source terminal of transistor 102 is also coupled to the source/drain terminal of programming transistor 204 which receives the signal Sel at its gate terminal. Circuit block 220 is disposed between the drain terminal of transistor 202 and supply voltage SH.

To adjust the pulldown strength of pulldown circuit 200, during a programming phase and post fabrication, memristor 205 is programmed to achieve a desired resistance. For example, to decrease the resistance of memristor 105 and thereby increase the pulldown strength of pulldown circuit 200, node D of transistor 204 is raised to a voltage that is higher than voltage SL. Signals VG is set to a relatively low voltage and signal Sel is set to a relatively high voltages thus causing transistor 202 to turn off and transistor 204 to turn on. Accordingly, a current is caused to flow from node D to supply voltage SL via memristor 205 thus causing the resistance of memristor 205 to decrease. The amount of decrease in the resistance of memristor 205 may be controlled by changing the duration or the amplitude of the current flow through memristor 205.

In a similar manner, to increase the resistance of memristor 205 and thereby decrease the pulldown strength of pulldown circuit 100, node D of transistor 104 is set to a voltage that is smaller than voltage SL. Signals VG is set to a relatively low voltage and signal Sel is set to a relatively high voltages thus causing transistor 202 to turn off and transistor 204 to turn on. Accordingly, a current is caused to flow from supply voltage SL to node D via memristor 205 thus causing the resistance of memristor 205 to increase. The amount of increase in the resistance of memristor 205 may be controlled by changing the duration or the amplitude of the current flow through the memristor.

In other embodiments, a current flow from node D to supply voltage SL via memristor 205 causes the resistance of memristor 205 to increase, and a current flow from supply voltage SH to node D via memristor 205 causes the resistance of memristor 205 to decrease. Accordingly, during the programming phase, the direction of the current flow through memristor 205 determines whether the memristor's resistance is to increases or decreases, and the duration or the amplitude of the current flow through the memristor determines the amount of such increase/decrease.

Figure 2B:
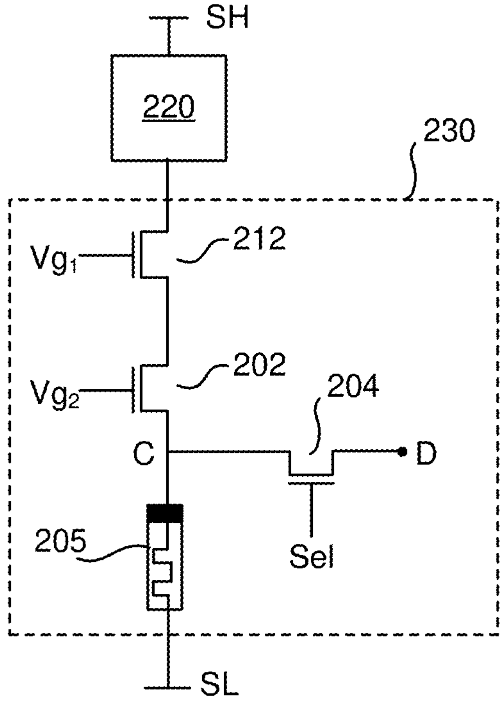
FIG. 2B is a schematic diagram of an example of a memristor-enabled pulldown circuit, in accordance with one embodiment of the present disclosure.

FIG. 2B is a schematic diagram of a memristor-enabled pulldown circuit 230, in accordance with another embodiment of the present disclosure. Memristor-enabled pulldown circuit 230 is similar to the memristor-enabled pulldown circuit 200 shown in FIG. 1B, except that memristor-enabled pulldown circuit 230 includes a second NMOS transistor 212 connected between the drain terminal of NMOS transistor 202 and node N to which circuit block 220 is connected. Select transistor 204 is used to change the pulldown strength of the pulldown block formed by NMOS transistors 202 and 212 in the same manner as described above with reference to FIG. 2A.

Figure 2C:
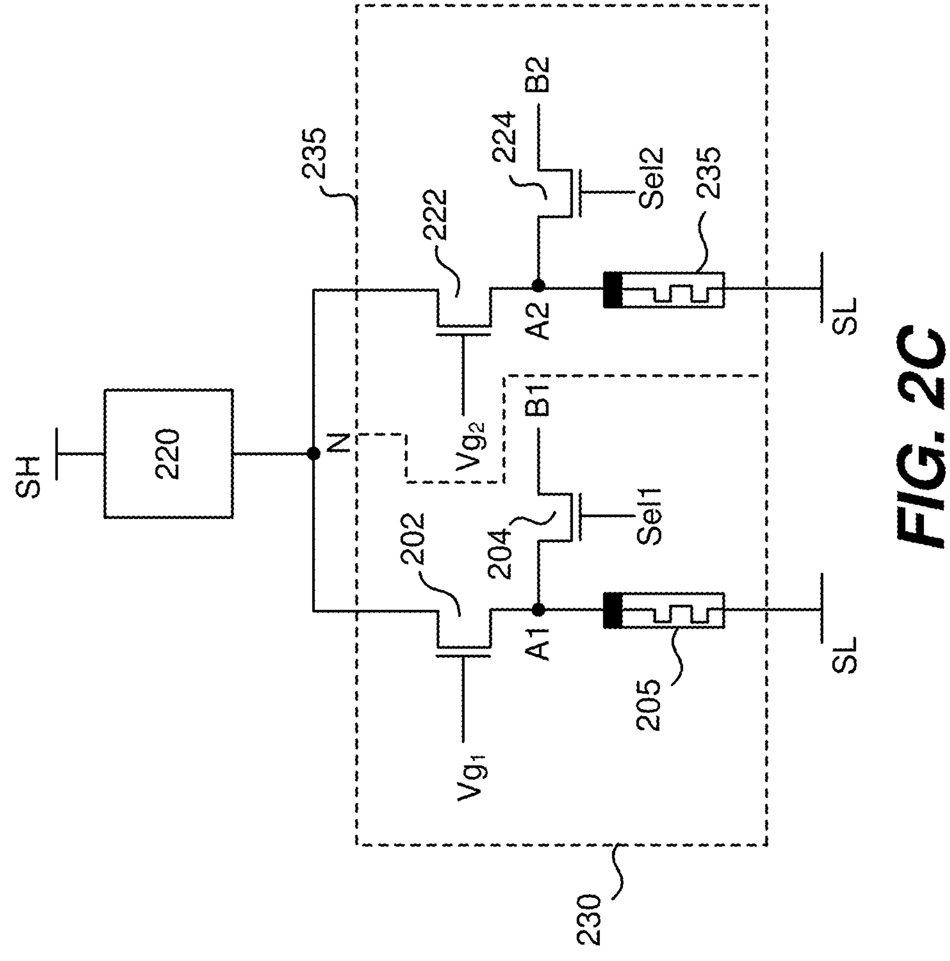
FIG. 2C is a schematic diagram of an example of a memristor-enabled pulldown circuit, in accordance with one embodiment of the present disclosure.

FIG. 2C is a schematic diagram of memristor-enabled pulldown circuits, in accordance with one embodiment of the present disclosure. NMOS transistor 202, select transistor 204, and programmable memristor 205 form a first memristor-enable pulldown circuit 230. NMOS transistor 222, select transistor 224, and programmable memristor 225 form a second memristor-enable pulldown circuit 235. Memristor 205 may be programmed via select transistor 204 to change the pulldown strength of NMOS transistor 202, and memristor 235 may be programmed via select transistor 224 to change the pulldown strength of NMOS transistor 222 in the same manner as was described above with reference to FIG. 2A.

Figure 2D:
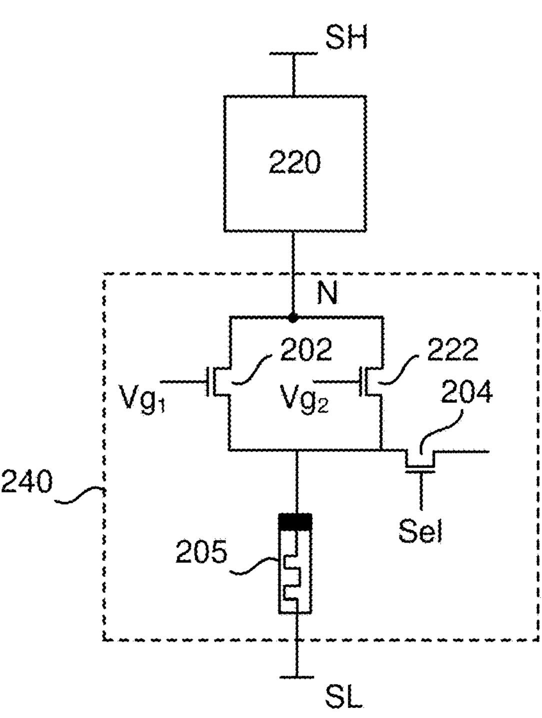
FIG. 2D is a schematic diagram of an example of a memristor-enabled pulldown circuit, in accordance with one embodiment of the present disclosure.

FIG. 2D is a schematic diagram of a memristor-enabled pulldown circuit 240, in accordance with one embodiment of the present disclosure. Memristor-enabled pulldown circuit 240 is similar to memristor-enabled pulldown circuits 230 and 235 shown in FIG. 2C, except that in memristor-enabled pulldown circuit 240, a single memristor 205 is used for both NMOS transistors 202 and 222. Memristor-enabled pulldown circuit 240 is also shown as including a single select transistor 204 used to program memristor 205.

Figure 2E:
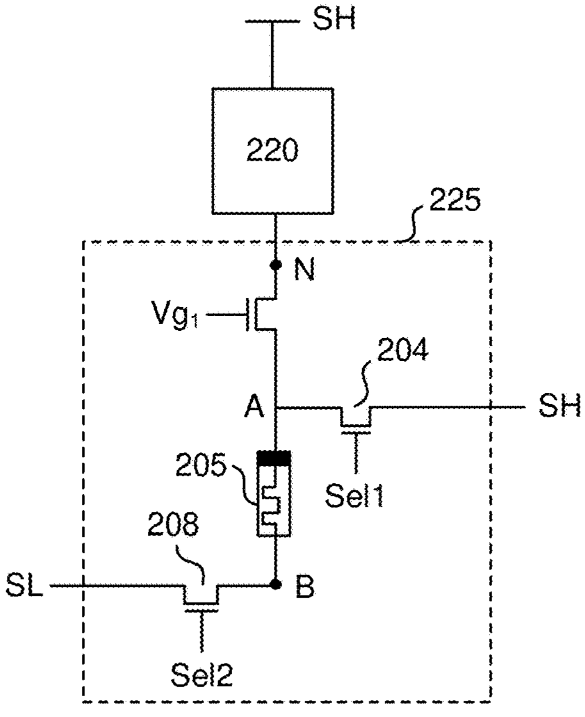
FIG. 2E is a schematic diagram of an example of a memristor-enabled pulldown circuit, in accordance with one embodiment of the present disclosure.

FIG. 2E is a schematic diagram of a memristor-enabled pullup circuit 225, in accordance with another embodiment of the present disclosure. Memristor-enabled pullup circuit 225 is similar to memristor-enabled pullup circuit 200 shown in FIG. 2A, except that memristor-enabled pullup circuit 225 includes a pair of select terminals 208 and 204. The first terminal of memristor 205 is shown as being connected to node A, as is also shown in FIG. 1A. The second terminal of memristor 205 is connected to node B which is also connected to the source/drain terminal of transistor 208. The drain/source terminal of transistor 208 is connected to supply voltage SL. To program memristor 205, a current is caused to flow from supply voltage SH to supply voltage SL through select transistor 204, memristor 205 and select transistor 208. It is understood that any number of select transistors may be used to program a memristor, in accordance with embodiments of the present disclosure allowing embedding the memristor within design blocks.

Figure 3A:
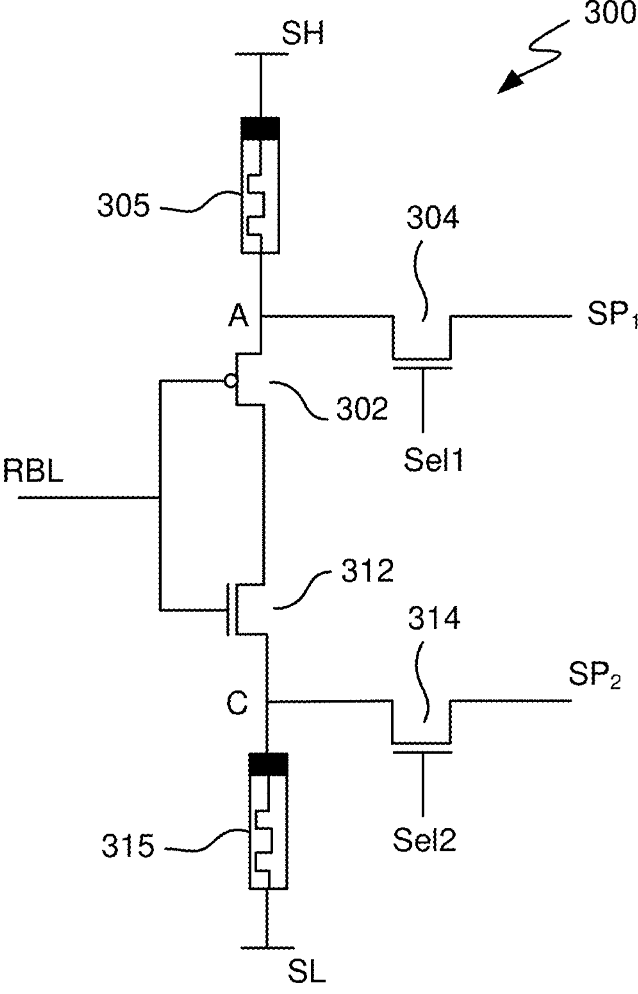
FIG. 3A is a schematic diagram of an example of a memristor-enabled inverter, in accordance with one embodiment of the present disclosure.

FIG. 3A is a schematic diagram of a memristor-enabled inverter 300, in accordance with one embodiment of the present disclosure. Memristor-enabled inverter 300 includes a PMOS pullup transistor 302, an NMOS pulldown transistor 312, a first memristor 305 disposed between the source terminal A of transistor 302 and supply voltage SH, a second memristor 315 disposed between the source terminal C of transistor 312 and supply voltage SL, a first select transistor 304 disposed between nodes A and SP1, and a second select transistor 314 disposed between nodes C and SP2.

The pullup strength of inverter 300 may be adjusted by programming memristor 305 in the same manner as was described above with reference to FIG. 1. The pulldown strength of inverter 300 may be adjusted by programming memristor 315 in the same manner as was described above with reference to FIG. 2. By changing the pullup strength and/or the pulldown strength of inverter 300, the switching threshold of inverter 300 may be varied.

Table I of FIG. 3B shows in one embodiment the voltages applied to various nodes/terminals of memristor-enable inverter 300 during both programming phase, as well as during the normal operation of the inverter. Voltage VH refers to the voltage supplied to the circuit during the specific operation and may vary based on target programming level, programming algorithm, or normal operation, and voltage VL refers to the ground or the virtual ground potential. For example, during programming of memristor 305, if SH is set to VH, then SP1 is set to VL; similarly if SH is set to VL, then SP1 is set to VH. During the normal operation, node RBL, which is the input terminal of the inverter, receives a signal from circuitry (not shown) driving inverter 300.

Figure 3C:
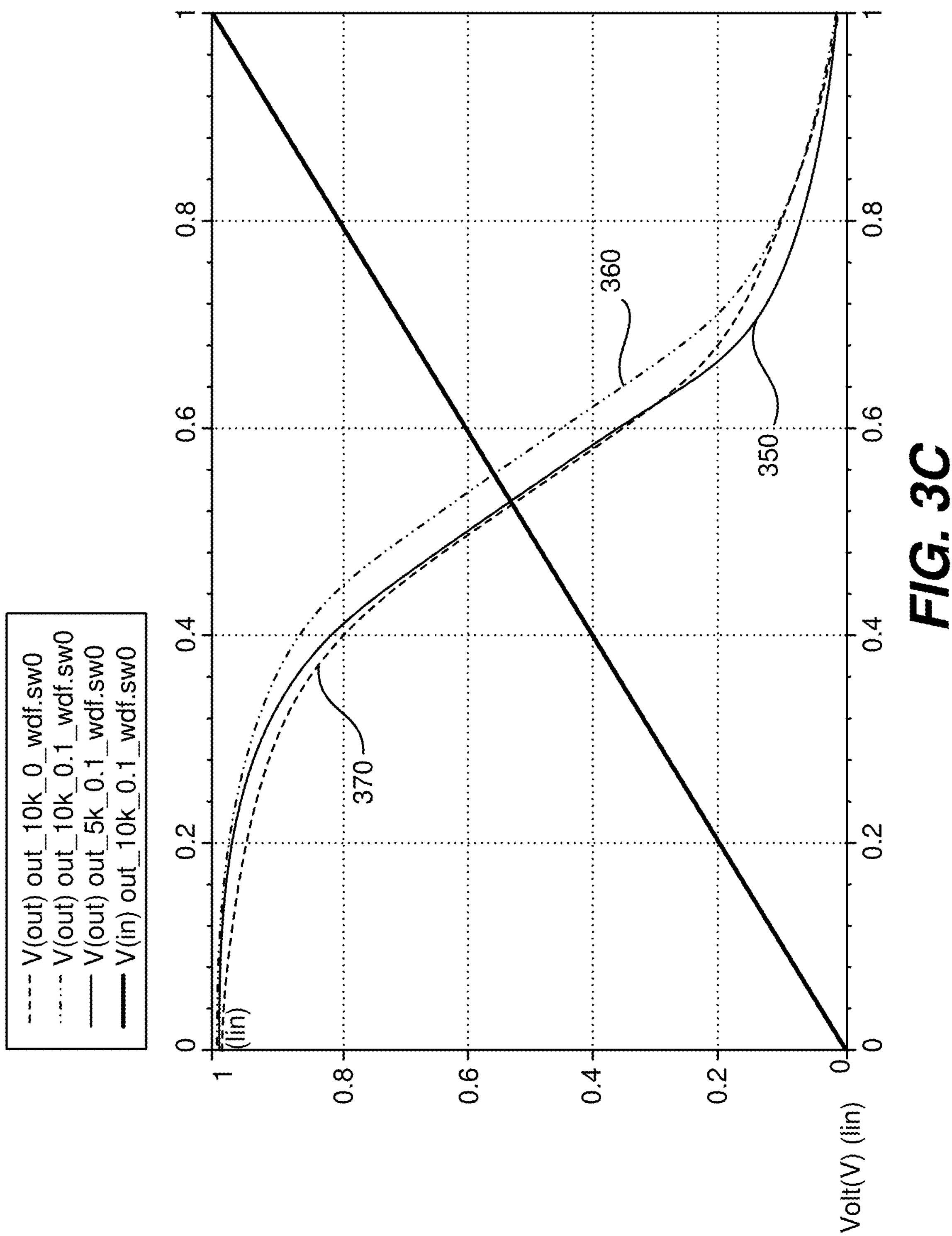
FIG. 3C shows computer simulation results of the inverter of FIG. 3A prior to and after programming of the memristors, in accordance with one embodiment of the present disclosure.

FIG. 3C shows computer simulation results of an example of the inverter shown in FIG. 3A in which transistors 302 and 312 have a threshold voltage of 0.3 volt. Plot 350 of FIG. 3C shows the output voltage as a function of the input voltage of inverter 300 of FIG. 3A when memristor 315 is programmed to have a value of 10K ohms. Plot 360 shows the output voltage as a function of the input voltage of the inverter 300 of FIG. 3A when the threshold voltage of NMOS transistor 302 is 0.4 volt, which is higher than the target threshold voltage of 0.3 volt, caused by, for example, statistical variations during fabrication, aging, and the like. Memristor 315 has a value of 10K ohms in plot 360. As is seen from FIG. 3C, the switching threshold of the inverter increases in plot 360 relative to plot 350 as a result of the increase in the threshold voltage of NMOS transistor 302.

Plot 370 shows the output voltage as a function of the input voltage of the inverter 300 when NMOS transistor 302 has a threshold voltage of 0.4 volt but the memristor 315 is programmed to have a resistance of 5K ohms. As a result of the decrease in the resistance of memristor 315 from 10K to 5K through programming of the memristor, in accordance with embodiments of the present disclosure, the switching threshold voltage of inverter 300 changes to that shown in plot 370, which is substantially similar to that shown in plot 350. Therefore, in accordance with one aspect of the present disclosure, the effects of the statistical variations in processing, aging, leakage, and the like, is mitigated using a memristor. In an alternate embodiment, memristor programming can be used to tune up or down the switching level of the inverter to compensate for variations within the inverter and leakages affecting the high and low voltage range of the memory bitlines to which the inverter is connected, hence taking into consideration in-situ effects on the desired functionality.

Figure 4A:
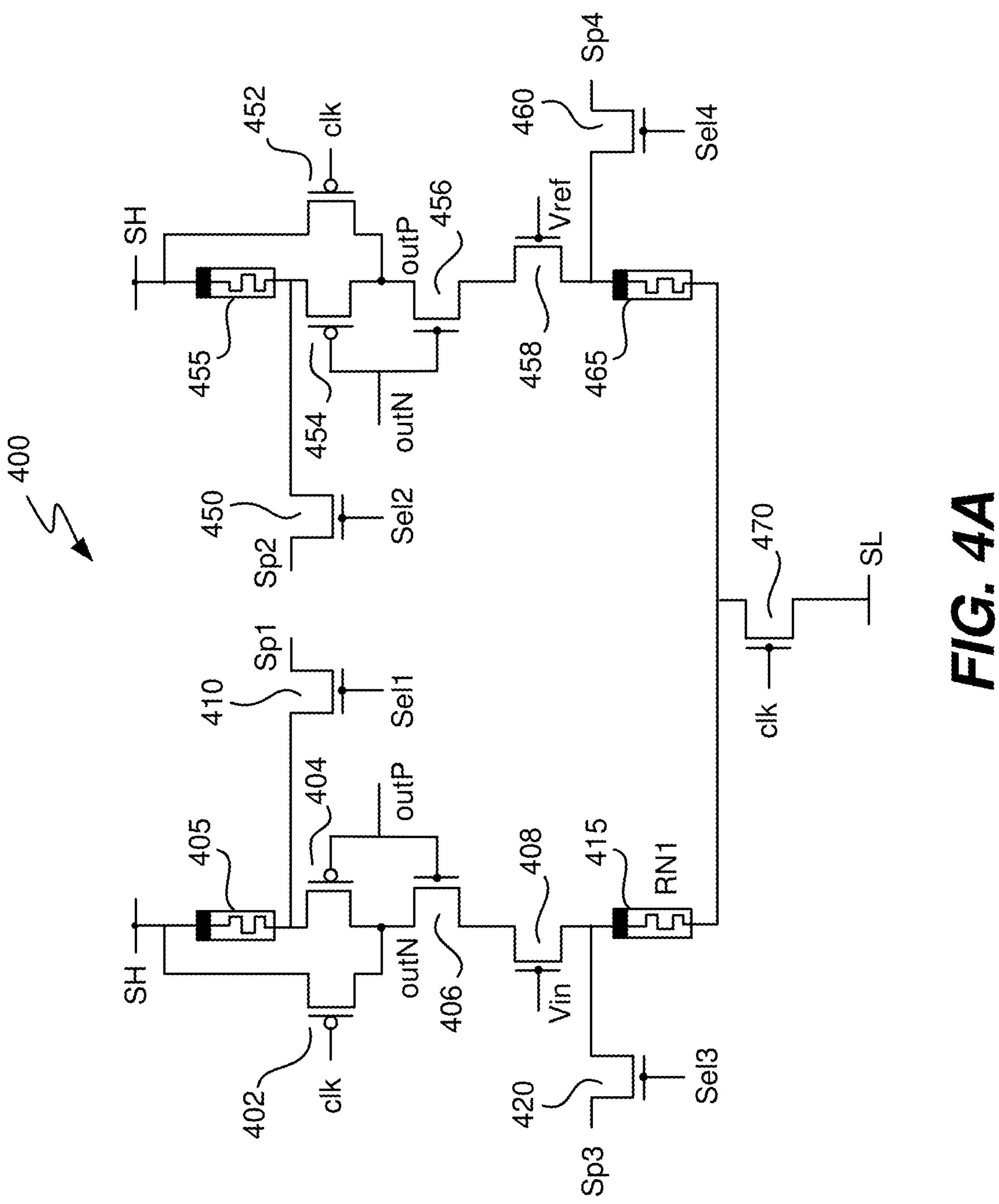
FIG. 4A is a transistor schematic diagram of a programmable differential comparator, in accordance with one embodiment of the present disclosure.

FIG. 4A is a transistor schematic diagram of a programmable differential comparator 400, in accordance with one embodiment of the present disclosure. Programmable differential comparator (hereinafter comparator) 400 is shown as including PMOS transistors 402, 404, 452, 454, NMOS transistors 406, 408, 456, 458, 410, 420, 450, 460 and memristors 405, 415, 455 and 465. Comparator 400 is adapted to compare the received input voltage Vin to the reference voltage Vref and set the differential output signals OutP and OutN accordingly. If Vin is greater than Vref, signals OutP and OutN are set to differential voltages SH and SL respectively. Conversely, if Vin is smaller than Vref, signals OutP and OutN are set to differential voltages SL and SH respectively.

Memristor 405 is used to change the pullup strength of PMOS transistor 404. NMOS select transistor 410 can be used to program Memristor 405 as was described above with reference to FIG. 1. Similarly, memristor 455 is used to change the pullup strength of PMOS transistors 454. NMOS select transistor 450 can be used to program Memristor 455. Memristor 415 is used to change the pulldown strength of NMOS transistors block shown as including transistors 408 and 406. This can be achieved by programming Memristor 415 via NMOS select transistor 420, as was described above with reference to FIG. 2. Similarly, memristor 465 is used to change the pulldown strength of NMOS transistors block shown as including transistors 458 and 456. This can be achieved by programming Memristor 465 via NMOS select transistor 460.

Table II depicted in FIG. 4B shows the voltages applied to various nodes/terminals of comparator 400 during both programming and normal operations. As can be seen from Table II to program memristor 405, clock signal Clk is set from a low voltage VL to a high voltage VH to turn off transistors 402 and 452 after nodes OUTP and OUTN are precharged through transistors 404 and 454. signal Sel1 is then increased to a high voltage to turn on select transistor 410. The difference between the voltage at SH and the voltage at SP1 is then increased to program the memristor. For example, the voltage at SH is set to VH and the voltage at Sp1 is set to VL to increase the resistance of memristor 405 in the same manner as was described above with reference to FIG. 1. Alternatively, for example, the voltage at SH is set to VL and the voltage at Sp1 is set to VH to decrease the resistance of memristor 405. Memristor 455 is programmed in the same manner as memristor 405. Vin and Vref are set to low voltages during programming of memristors 405 and 455.

To program memristor 415, signal VIN is set to a low voltage to turn off transistor 408, and signal Clk is set to a high voltage to turn on transistor 470. Signal Sel3 is then set to a high voltage to turn on transistor 420. The difference between the voltage at SL and the voltage at SP3 is then increased to program memristor 415. For example, the voltage at SL is set to VL and the voltage at Sp3 is set to VH to decrease the resistance of memristor 415 in the same manner as was described above with reference to FIG. 2. Alternatively, for example, the voltage at SL is set to VH and the voltage at Sp3 is set to VL to increase the resistance of memristor 415. Memristor 465 is programmed in the same manner as memristor 415.

After the memristors are programmed, select signals Sel1, Sel2, Sel3 and Sel4 are set to a low voltage level VL during the normal mode of operation, thereby causing select transistors 410, 420, 450 and 460 to be off. To compare signal Vin to signal Vref, the clock signal clk is set to a low voltage for a specified time period, thus causing (i) signal OutN to be precharged to the SH voltage level (VH) via transistor 402, and (ii) signal OutP to be precharged to the SH voltage level (VL) via transistor 452.

If signal Vin is greater than signal Vref, transistor 408 becomes more conductive than transistor 458, in turn causing signal OutN to start discharging (via NMOS transistors 406, 408, 470, and memristor 415) faster than signal OutP. Accordingly, PMOS transistors 454 starts to become more conductive than transistor 404, and transistor 456 starts to become less conductive than transistor 406. The switching of the transistors 404, 406, 454 and 456 continues until signal OutP receives the SH voltage level, and signal OutN receives the SL voltage.

Conversely, if signal Vin is smaller than signal Vref, transistor 458 becomes more conductive than transistor 408, in turn causing signal OutP to start discharging (via NMOS transistors 456, 458, memristor 465 and transistor 470) faster than signal OutN. Accordingly, PMOS transistors 404 starts to become more conductive than transistor 454, and transistor 406 starts to become less conductive than transistor 456. The switching of the transistors 404, 406, 454 and 456 continues until signal OutN receives the SH voltage level, and signal OutP receives the SL voltage level.

Figure 4C:
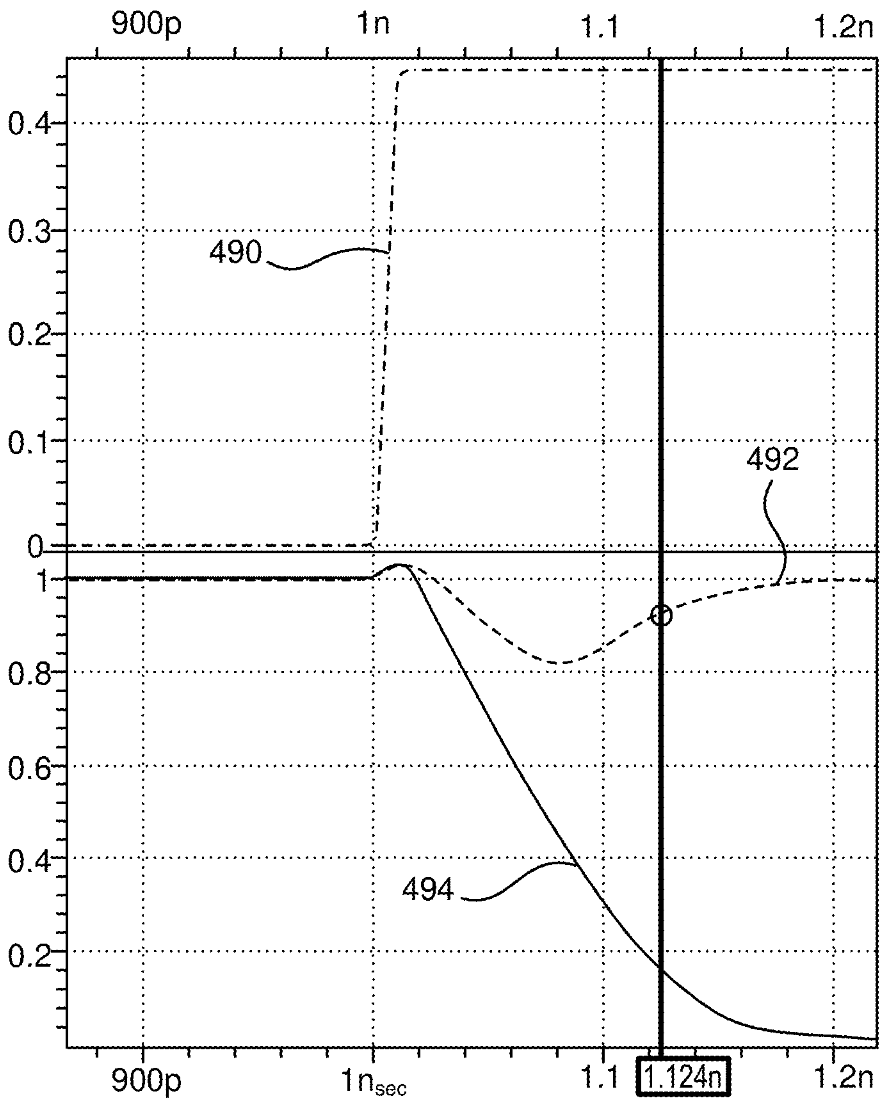
FIG. 4C shows computer simulation results of the comparator of FIG. 4A, in accordance with one embodiment of the present disclosure.

FIG. 4C shows computer simulation results of an example of comparator 400 of FIG. 4A when the supply voltage SH is set to 1 volt. For the example shown in FIG. 4C, comparator 400 is specified to receive a reference voltage Vref of 0.5 volts. Accordingly, if the input voltage Vin is smaller than 0.5 volts, differential output OutP is at 0 volts and the differential output OutN is at 1 volt. For simplicity, only the differential output OutN is shown in FIG. 4C. Input voltage Vin, represented by plot 490, is shown as switching from 0 volt to 0.44 volts at time 1 nsec. Because Vin (0.44 volts) is less than Vref (0.5 volts), differential output OutN, as represented by plot 492 does not switch from 1 to 0 volt.

Plot 494 shows differential output OutN of comparator 400 when, for example, due to statistical variations during manufacturing, the threshold voltage of the NMOS transistor 408 is 0.1 volt less than its target value. Due to this change in the threshold voltage, differential output OutN is seen as switching from 1 volt to 0 volt in plot 494 in response to the change in Vin, despite the fact that Vin is smaller than Vref. To correct this variability, the resistance of programmable memristor 415 is changed to 5K ohms, in accordance with embodiments of the present disclosure. As a result of the change in resistance of programmable memristor 415, the differential output OutN of comparator 400 operates as targeted so as to have substantially the same characteristics as shown in plot 492 and to correct for the original expected response over the range of possible input voltages.

Figure 5A:
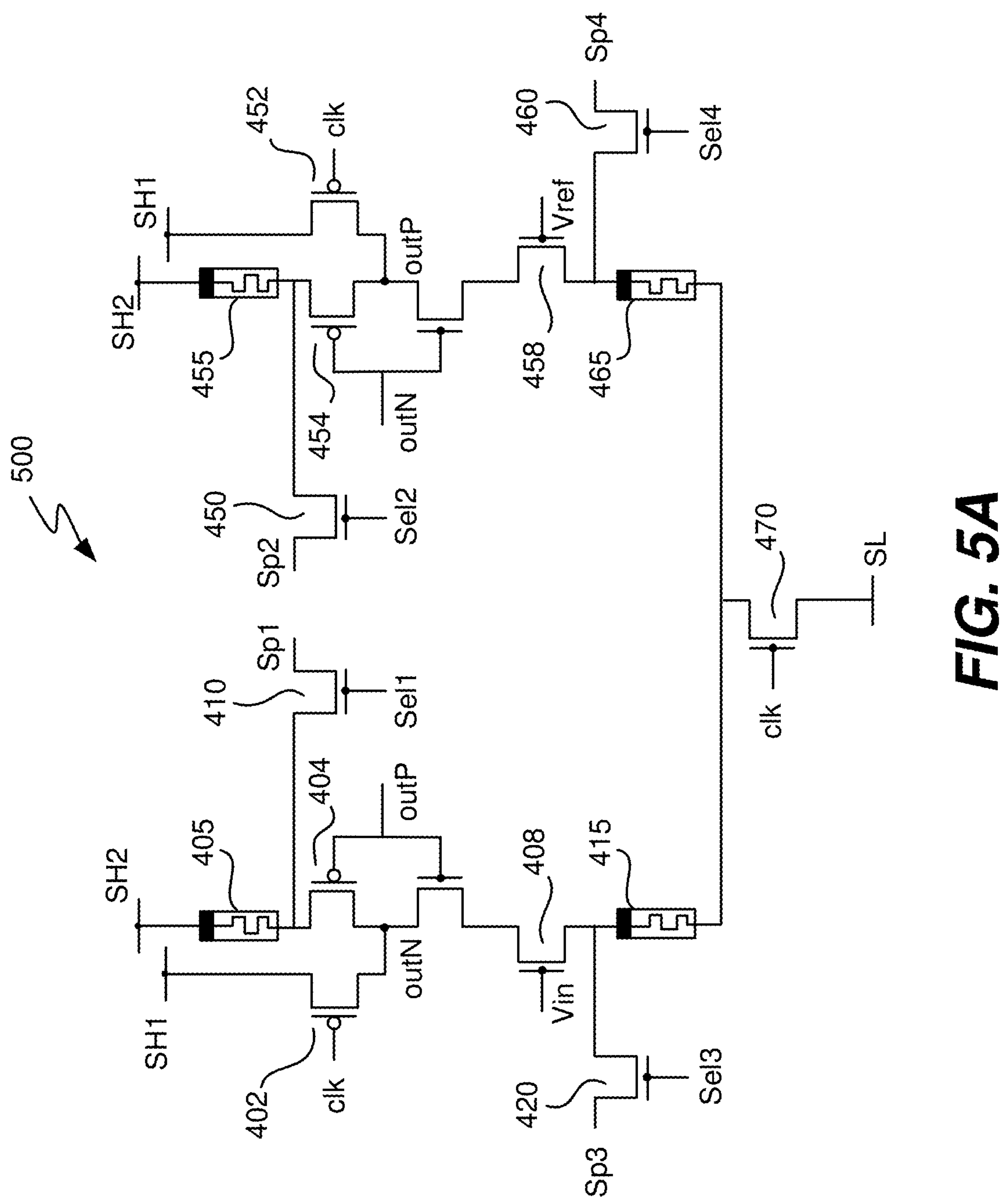
FIG. 5A is a transistor schematic diagram of a programmable differential comparator, in accordance with one embodiment of the present disclosure.

FIG. 5A is a transistor schematic diagram of a programmable differential comparator 500, in accordance with another embodiment of the present disclosure. Comparator 500 is similar to comparator 400 except that comparator receives two different supply voltages SH1 and SH2. Supply voltage SH2 that supplies voltage to memristors 405 and 455 is isolated from supply voltage SH1 that supplies voltage to transistors 402 and 452 driven by clock signal Clk. Accordingly, during the programming of memristors 405 and 455, clock signal Clk may be set to a low voltage in comparator 500.

Table III depicted in FIG. 5B shows the voltages applied to various nodes/terminals of comparator 400 during both programming and normal operations. To program memristor 405, clock signal CLK is set to a low volage level and supply voltage SH1 is set to a high voltage level, thus causing output node OutP to be charged to SH1 voltage via transistor 452, in turn causing PMOS transistor 404 to be turned off. During the programming of memristor 405, voltages Vin and Vref are also at low levels thus causing NMOS transistors 408 and 458 to be off. Signal Sel1 is then increased to a high voltage to turn on select transistor 410. The difference between the voltage at SH2 and the voltage at SP1 is then increased to program the memristor. For example, the voltage at SH2 is set to VH and the voltage at Sp1 is set to VL to increase the resistance of memristor 405 in the same manner as was described above with reference to FIG. 1. Alternatively, for example, the voltage at SH2 is set to VL and the voltage at Sp1 is set to VH to decrease the resistance of memristor 405. Memristor 455 is programmed in the same manner as memristor 405.

To program memristor 415, signal VIN is set to a low voltage to turn off transistor 408, and signal Clk is set to a high voltage to turn off transistor 402. Signal Sel3 is then set to a high voltage to turn on transistor 420. The difference between the voltage at SL and the voltage at SP3 is then increased to program memristor 415. For example, the voltage at SL is set to VL and the voltage at Sp3 is set to VH to decrease the resistance of memristor 415 in the same manner as was described above with reference to FIG. 2. Alternatively, for example, the voltage at SL is set to VH and the voltage at Sp3 is set to VL to decrease the resistance of memristor 415. Memristor 465 is programmed in the same manner as memristor 405.

Figure 6:
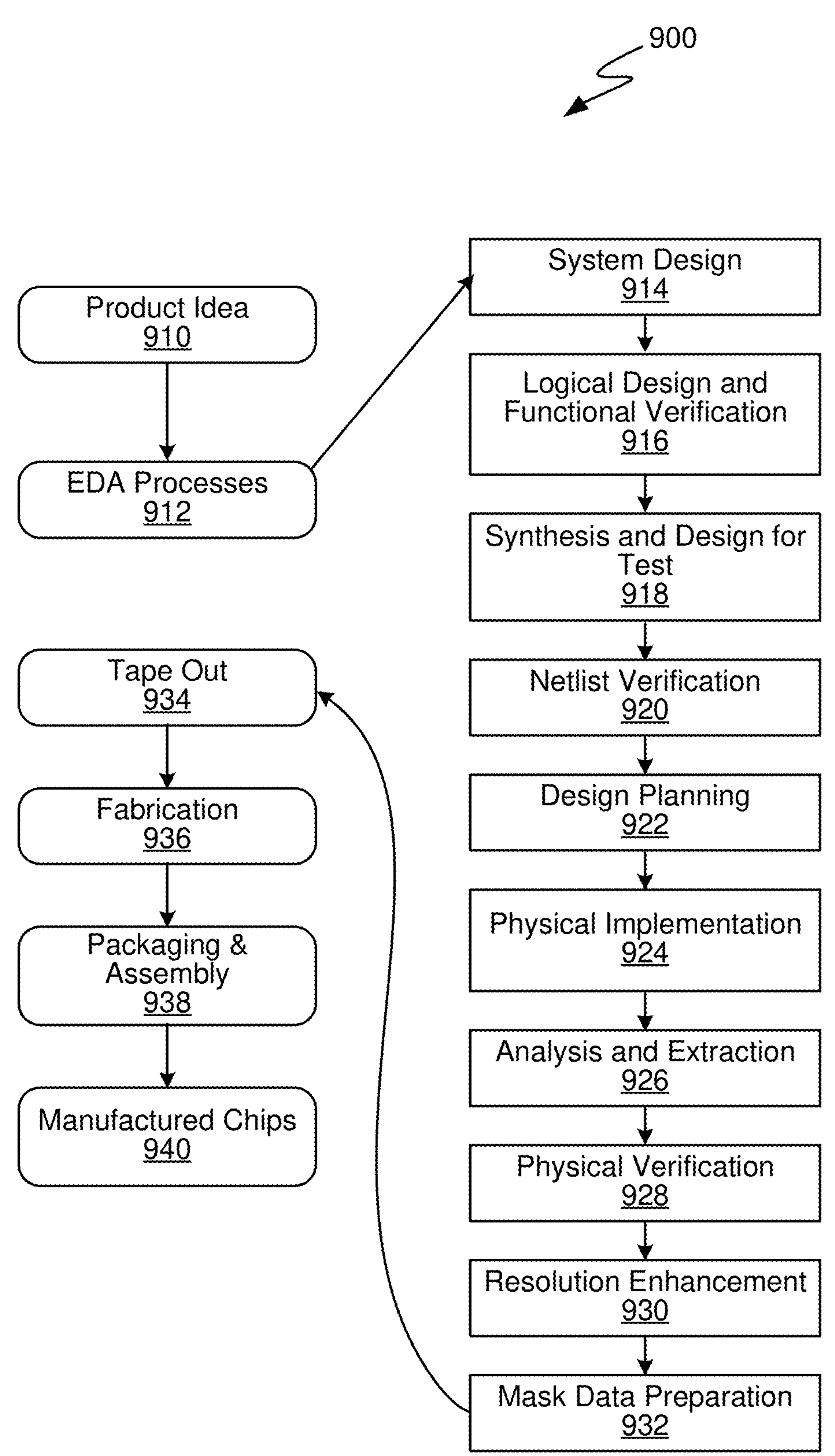
FIG. 6 depicts a flowchart of various processes used during the design and manufacture of an integrated circuit in accordance with some embodiments of the present disclosure.

FIG. 6 illustrates an example set of processes 900 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 910 with information supplied by a designer, information which is transformed to create an article of manufacture that uses a set of EDA processes 912. When the design is finalized, the design is taped-out 934, which is when artwork (e.g., geometric patterns) for the integrated circuit is sent to a fabrication facility to manufacture the mask set, which is then used to manufacture the integrated circuit. After tape-out, a semiconductor die is fabricated 936 and packaging and assembly processes 936 are performed to produce the finished integrated circuit 940.

Specifications for a circuit or electronic structure may range from low-level transistor material layouts to high-level description languages. A high-level description may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower level description adds more useful detail into the design description, for example, more details for the modules that include the description. The lower levels of description can be generated by a computer, derived from a design library, or created by another design automation process. An example of a specification language at a lower level language for specifying more detailed descriptions is SPICE, which is used for detailed descriptions of circuits with many analog components. Descriptions at each level is enabled for use by the corresponding tools of that layer (e.g., a formal verification tool). A design process may use a sequence depicted in FIG. 9. The processes described by be enabled by EDA products (or tools).

During system design 914, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 916, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 918, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 920, the netlist is checked for compliance with timing constraints and for correspondence with the HDL code. During design planning 922, an overall floor plan for the integrated circuit is constructed and analyzed for timing and top-level routing.

During layout or physical implementation 924, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 926, the circuit function is verified at the layout level, which permits refinement of the layout design. During physical verification 928, the layout design is checked to ensure that manufacturing constraints are correct, such as DRC constraints, electrical constraints, lithographic constraints, and that circuitry function matches the HDL design specification. During resolution enhancement 930, the geometry of the layout is transformed to improve how the circuit design is manufactured.

During tape-out, data is created to be used (after lithographic enhancements are applied if appropriate) for production of lithography masks. During mask data preparation 932, the 'tape-out' data is used to produce lithography masks that are used to produce finished integrated circuits.

A storage subsystem of a computer system (such as computer system 1100 of FIG. 7) may be used to store the programs and data structures that are used by some or all of the EDA products described herein, and products used for development of cells for the library and for physical and logical design that use the library.

Figure 7:
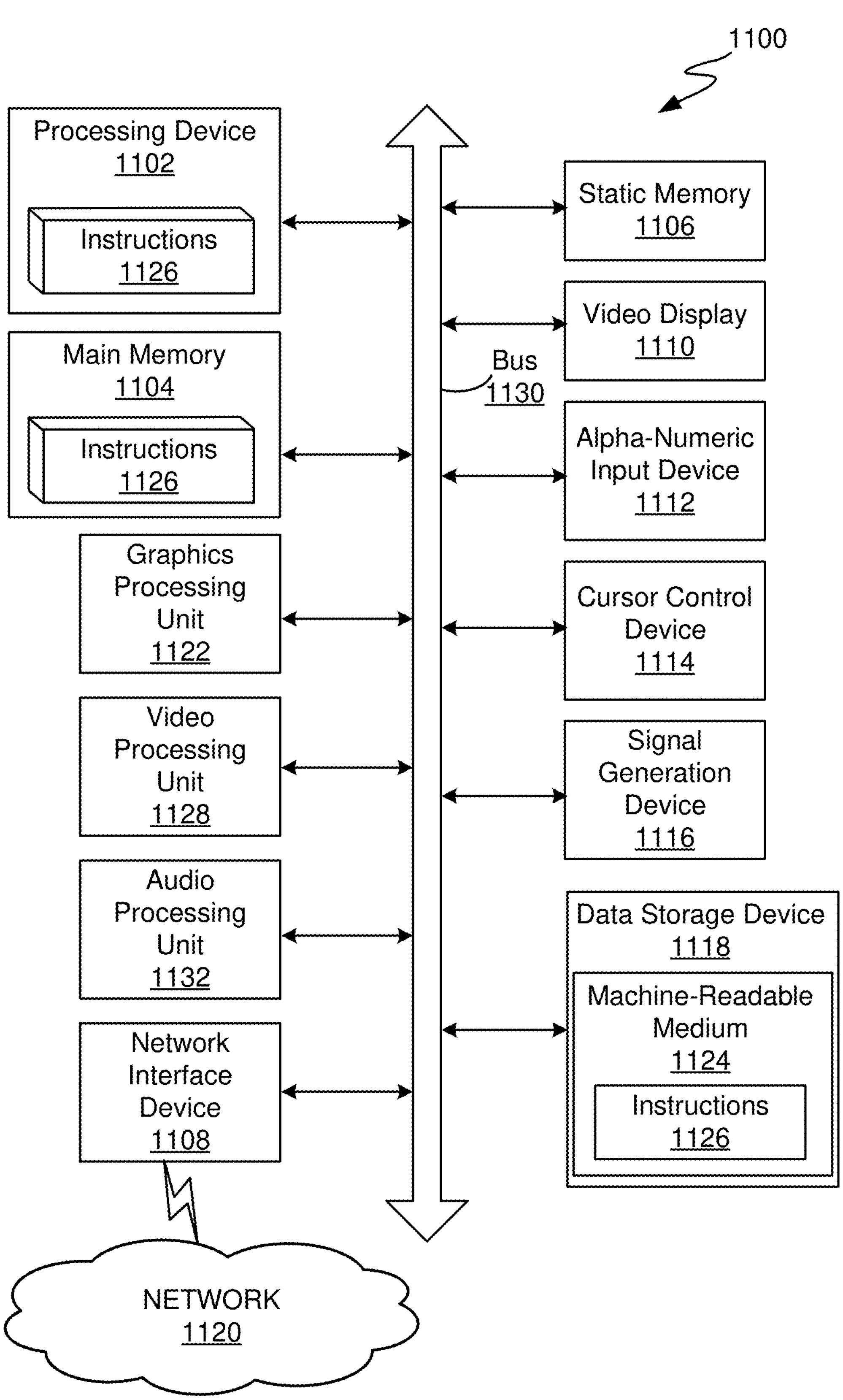
FIG. 7 depicts an example diagram of an example computer system in which embodiments of the present disclosure may operate.

FIG. 7 illustrates an example machine of a computer system 1100 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM), a static memory 1106 (e.g., flash memory, static random access memory (SRAM), etc.), and a data storage device 1118, which communicate with each other via a bus 1130.

Processing device 1102 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 may also be one or more special-purpose processing devices such as an application specific integrated circuit (ASIC), a field programmable gate array (FPGA), a digital signal processor (DSP), network processor, or the like. The processing device 1102 may be configured to execute instructions 1126 for performing the operations and steps described herein.

The computer system 1100 may further include a network interface device 1108 to communicate over the network 1120. The computer system 1100 also may include a video display unit 1110 (e.g., a liquid crystal display (LCD) or a cathode ray tube (CRT)), an alphanumeric input device 1112 (e.g., a keyboard), a cursor control device 1114 (e.g., a mouse), a graphics processing unit 1122, a signal generation device 1116 (e.g., a speaker), graphics processing unit 1122, video processing unit 1128, and audio processing unit 1132.

The data storage device 1118 may include a machine-readable storage medium 1124 (also known as a non-transitory computer-readable medium) on which is stored one or more sets of instructions 1126 or software embodying any one or more of the methodologies or functions described herein. The instructions 1126 may also reside, completely or at least partially, within the main memory 1104 and/or within the processing device 1102 during execution thereof by the computer system 1100, the main memory 1104 and the processing device 1102 also constituting machine-readable storage media.

In some implementations, the instructions 1126 include instructions to implement functionality corresponding to the present disclosure. While the machine-readable storage medium 1124 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1102 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

What is claimed:

1. A circuit comprising:

a first PMOS transistor having a source terminal coupled to a first node and a drain terminal coupled to a second node;

a first programmable memristor having a first terminal coupled to the first node and a second terminal adapted to receive a first voltage; and a first select transistor having a first source/drain terminal coupled to the first node, a second drain/source terminal coupled to a third node adapted to receive a second voltage, and a gate terminal receiving a first select signal, wherein a resistance of the first programmable memristor is responsive to a difference between the first and second voltages thereby to change a pullup strength of the first PMOS transistor, wherein the resistance of the first programmable memristor increases if the first voltage is greater than the second voltage, and wherein the resistance of the first programmable memristor decreases if the second voltage is greater than the first voltage.

2. The circuit of claim 1 further comprising:

a first NMOS transistor having a drain terminal coupled to a fourth node and a source terminal coupled to a fifth node;

a second programmable memristor having a first terminal coupled to the fifth node and a second terminal coupled to a third voltage; and a second select transistor having a first source/drain terminal coupled to the fifth node, a second drain/source terminal coupled to a sixth node adapted to receive a fourth voltage, and a gate terminal receiving a second select signal, wherein a resistance of the second programmable memristor is responsive to a difference between the third and fourth voltages thereby to change a pulldown strength of the first NMOS transistor.

3. W The circuit of claim 2, wherein the second node is connected to the fourth node thus causing the first PMOS transistor and the first NMOS transistor to form an inverter.

4. The circuit of claim 3, wherein the third voltage is a ground voltage or a virtual ground voltage.

5. The circuit of claim 1, wherein the first select transistor is an NMOS transistor.

6. The circuit of claim 1 further comprising:

a second PMOS transistor having a source terminal coupled to the drain terminal of the first PMOS transistor, and a drain terminal coupled to a fourth node.

7. The circuit of claim 1 further comprising:

a second PMOS transistor having a source terminal coupled to a fourth node and a drain terminal coupled to the second node;

a second programmable memristor having a first terminal coupled to the fourth node and a second terminal adapted to receive the first voltage; and a second select transistor having a source/drain terminal coupled to the fourth node, a drain/source terminal coupled to a fifth node adapted to receive the second voltage, and a gate terminal receiving a second select signal, wherein a resistance of the second programmable memristor is responsive to a difference between the first and second voltages thereby to change a pullup strength of the second PMOS transistor.

8. The circuit of claim 1 further comprising:

a second PMOS transistor having a source terminal receiving the first voltage and a drain terminal coupled to the second node.

9. The circuit of claim 1 further comprising:

a second select transistor adapted to supply the first voltage to the second terminal of the first programmable memristor in response to a signal applied to a gate terminal of the second select transistor.

10. The circuit of claim 2 further comprising:

a second NMOS transistor having a source terminal coupled to the drain terminal of the first NMOS transistor;

a second PMOS transistor having a drain terminal coupled to a drain terminal of the second NMOS transistor, and a gate terminal coupled to a gate terminal of the second NMOS transistor;

a third programmable memristor coupled between a source terminal of the second PMOS transistor and a terminal supplying the first voltage;

a third NMOS transistor having a drain terminal coupled to the drain terminal of the first PMOS transistor, and a gate terminal coupled to a gate terminal of the first PMOS transistor;

a fourth NMOS transistor having a drain terminal coupled to a source terminal of the third NMOS transistor, and a gate terminal receiving a reference voltage;

a third programmable memristor coupled between a source terminal of the second PMOS transistor and a first supply terminal supplying the first voltage;

a fourth programmable memristor having a first terminal coupled to a source terminal of the fourth NMOS transistor;

a third PMOS transistor having a source terminal receiving the first voltage, a drain terminal coupled to a drain terminal of the second PMOS transistor, and a gate terminal receiving a clock signal;

a fourth PMOS transistor having a source terminal receiving the first voltage, a drain terminal coupled to the drain terminal of the first PMOS transistor, and a gate terminal receiving the clock signal; and a fifth NMOS transistor having a drain terminal coupled to a second terminal of the fourth programmable memristor, a source terminal receiving the third voltage, and a gate terminal receiving the clock signal.

11. A method comprising:

coupling a source terminal of a first PMOS transistor to a first node and a drain terminal of the first PMOS transistor to a second node;

coupling a first terminal of a first programmable memristor to the first node and a second terminal of the first programmable memristor to a first voltage;

coupling a first source/drain terminal of a first select transistor to the first node, a second drain/source terminal of the first select transistor to a third node adapted to receive a second voltage;

applying a first select signal to a gate terminal of the select transistor; and passing a first current through the first programmable memristor via the first select transistor to change a resistance of the first programmable memristor thereby to change a pullup strength of the first PMOS transistor, wherein the resistance of the first programmable memristor increases if the first voltage is greater than the second voltage, and wherein the resistance of the first programmable memristor decreases if the second voltage is greater than the first voltage.

12. The method of claim 11 further comprising:

forming a first NMOS transistor having a drain terminal coupled to a fourth node and a source terminal coupled to a fifth node;

forming a second programmable memristor having a first terminal coupled to the fifth node and a second terminal coupled to a third voltage;

forming a second select transistor having a first source/drain terminal coupled to the fifth node, a second drain/source terminal coupled to a sixth node adapted to receive a fourth voltage, and a gate terminal receiving a second select signal; and passing a second current through the second programmable memristor via the select transistor to change a resistance of the second programmable memristor thereby to change a pulldown strength of the first NMOS transistor.

13. The method of claim 12 further comprising:

connecting the second node to the fourth node to form an inverter between the first PMOS transistor and the first NMOS transistor.

14. The method of claim 13 wherein the third voltage is a ground voltage or a virtual ground voltage.

15. The method of claim 11 further comprising:

causing the first current to flow from the first terminal of the first programmable memristor to a fourth node supplying the first voltage.

16. The method of claim 11 further comprising:

causing the first current to flow from a fourth node supplying the first voltage to the first terminal of the first programmable memristor.

17. The method of claim 11, wherein the first select transistor is an NMOS transistor.

18. A system comprising:

a memory storing instructions; and a processor, coupled with the memory and to execute the instructions, the instructions when executed cause the processor to form a circuit comprising:

a first PMOS transistor having a source terminal coupled to a first node and a drain terminal coupled to a second node;

a first programmable memristor having a first terminal coupled to the first node and a second terminal adapted to receive a first voltage; and a first select transistor having a first source/drain terminal coupled to the first node, a second drain/source terminal coupled to a third node adapted to receive a second voltage, and a gate terminal receiving a first select signal, wherein a resistance of the first programmable memristor is responsive to a difference between the first and second voltages thereby to change a pullup strength of the first PMOS transistor, wherein the resistance of the first programmable memristor increases if the first voltage is greater than the second voltage, and wherein the resistance of the first programmable memristor decreases if the second voltage is greater than the first voltage.

19. The system of claim 18, wherein the circuit further comprises:

a first NMOS transistor having a drain terminal coupled to a fourth node and a source terminal coupled to a fifth node;

a second programmable memristor having a first terminal coupled to the fifth node and a second terminal coupled to a third voltage; and a second select transistor having a first source/drain terminal coupled to the fifth node, a second drain/source terminal coupled to a sixth node adapted to receive a fourth voltage, and a gate terminal receiving a second select signal, wherein a resistance of the second programmable memristor is responsive to a difference between the third and fourth voltages thereby to change a pulldown strength of the first NMOS transistor.

* * * * *